United States Patent [19]

Koehler

[11] 4,003,759

[45] Jan. 18, 1977

[54] ION IMPLANTATION OF GOLD IN MERCURY CADMIUM TELLURIDE

[75] Inventor: Toivo Koehler, Lexington, Mass.

[73] Assignee: Honeywell Inc., Minneapolis, Minn.

[22] Filed: Mar. 1, 1976

[21] Appl. No.: 662,293

[52] U.S. Cl. ............................. 148/1.5; 148/187; 148/188; 357/91

[51] Int. Cl.$^2$ ...................................... H01L 21/265

[58] Field of Search ............... 148/1.5, 188; 357/91

[56] References Cited

UNITED STATES PATENTS

| | | | |
|---|---|---|---|
| 3,341,754 | 9/1967 | Kellett et al. | 148/1.5 X |
| 3,655,457 | 4/1972 | Duffy et al. | 148/1.5 |
| 3,743,553 | 7/1973 | Scott et al. | 148/188 |

OTHER PUBLICATIONS

Foyt et al., "Type Conversion and n-p Junction Formation in $Hg_{1-x}Cd_xTe$——" Appl. Phys. Lett., vol. 18, No. 8, 15 Apr., 1971, pp. 321–323.

Marine et al., "Infrared Photovoltaic Detectors from Ion Implanted $Cd_xHg_{1-x}Te$," Appl. Phys. Lett., vol. 23, No. 8, 15 Oct. 1973, pp. 450–452.

Fiorito et al., "Hg-Implanted $Hg_{1-x}Cd_xTe$ Infrared Photovoltaic Detectors" Appl. Phy. Lett. vol. 23, No. 8, 15 Oct. 1973, pp. 448–449.

Melgailis et al., "Electron Radiation Damage and Annealing of $Hg_{1-x}Cd_xTe$——" J. Appl. Phys. vol. 44, No. 6, June 1973, pp. 2647–2651.

*Primary Examiner*—L. Dewayne Rutledge
*Assistant Examiner*—J. M. Davis
*Attorney, Agent, or Firm*—David R. Fairbairn

[57] ABSTRACT

PN junctions in mercury cadmium telluride are formed by implantation of gold ions and a subsequent low temperature—short duration heat treatment.

7 Claims, No Drawings

ION IMPLANTATION OF GOLD IN MERCURY CADMIUM TELLURIDE

ORIGIN OF THE INVENTION

This invention was made in the course of a contract with the Department of the Army.

BACKGROUND OF THE INVENTION

The present invention is concerned with mercury cadmium telluride semiconductor devices. In particular, the present invention is directed to a method of introducing acceptor impurities into mercury cadmium telluride. For the purposes of this specification, the common chemical equations for mercury cadmium telluride, (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g = 1.6$ Ev), with mercury cadmium telluride, which is a semimetal having a negative energy gap of about $-0.3$ Ev. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths from about 1 to 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable.

The formation of PN junctions in (Hg,Cd)Te is complicated by the small dissociation energy of mercury telluride in the alloy. The formation of PN junctions must not cause excessive dissociation of the mercury telluride, since this will adversely affect the electrical and optical properties of the resulting device.

Several techniques have been developed for forming n-type layers on a p-type body of (Hg,Cd)Te. Among these techniques are bombardment with protons, electrons, or mercury ions. These techniques create an n-type layer by creating a damage-induced donor state. These techniques are described in Foyt et al., "Type Conversion and n-p Junction Formation in $Hg_{1-x}Cd_xTe$ Produced by Proton Bombardment", Appl. Phys. Let., 18, 321 (1971); Melngailis et al., "Electron Radiation Damage and Annealing of $Hg_{1-x}Cd_xTe$ at Low Temperatures", J. Appl. Phys., 44, 2647 (1973); and Fiorito et al., "Hg-Implanted $Hg_{1-x}Cd_xTe$ Infrared Photovoltaic Detectors in the 8- to 14-$\mu$m Range", Appl. Phys. Let., 23, 448 (1973).

Another technique of forming n-type layers on p-type (Hg,Cd)Te is described by Marine et al., "Infrared Photovoltaic Detectors From Ion-Implanted $Cd_xHg_{1-x}Te$", Appl. Phys. Let., 23, 450 (1973). This method involves aluminum ion implantation and a subsequent anneal at 300° C for 1 hour to form an n-type region in a p-type (Hg,Cd)Te body.

Techniques for forming a p-type layers on n-type (Hg,Cd)Te, however, are not as well developed. On common method of forming p-type regions in n-type (Hg,Cd)Te is by depositing a gold layer on a surface of the n-type body and then heating the body to diffuse the gold, thereby forming a region of p-type conductivity. This method is described in U.S. Pat. No. 3,743,553 by M.W. Scott et al. While this method is generally satisfactory, it does have some shortcomings. In particular, it is difficult to form very abrupt, well defined PN junctions because gold diffuses extremely rapidly in (Hg,Cd)Te. Devices such as reach-through avalanche photodiodes and wide bandwidth photodiodes, therefore, are difficult, if not impossible, to fabricate using gold diffusion.

SUMMARY OF THE INVENTION

The present invention is a method of introducing acceptor impurities into a region of a (Hg,Cd)Te body. This method allows fabrication of abrupt, well-defined PN junctions in (Hg,Cd)Te.

The method of the invention comprises implanting gold ions into the (Hg,Cd)Te body and heat treating the body at a relatively low temperature for a short duration.

DETAILED DESCRIPTION OF THE PREFERRED EMBODIMENTS

In the preferred embodiments of the present invention, gold ions are implanted into are implanted into a (Hg,Cd)Te body. The preferred energy for the implanting of gold ions is greater than about 100 KeV and the preferred dose is typically between about $10^{12}$ ions per cm² and about $10^{13}$ ions per cm².

The body is then heat treated at a temperature of between about 150° and about 250° C for a time of between about 2 minutes and about 40 minutes. This extremely low temperature—short duration heat treatment is required to diffuse the gold to electrically active positions in the crystal lattice. Since the diffusion of gold in (Hg,Cd)Te is very rapid, the heat treatment must be at as low a temperature as possible and for as short a time as possible in order to confine the gold impurities to within the desired region.

It has been discovered that temperatures greater than about 250° C and heat treatment durations of greater than about 40 minutes result in unacceptable PN junctions. On the other hand, temperatures of less than about 150° C and heat treatment durations of less than about 2 minutes are insufficient to result in acceptable PN junctions. The most preferred temperature for heat treatment is about 200° C and the time duration is preferrably about 5 minutes. These time durations include the brief heat-up time; the actual time-at-temperature is slightly less.

In one preferred embodiment of the present invention, a passivating layer was formed on a surface of an n-type (Hg,Cd)Te body. This passivating layer was ZnS. A photoresist mask, which was impervious to the gold ions was then formed on the passivating layer in order to define the desired p-type region. Gold ions having a dose of between about $10^{12}$ ions per cm and $10^{13}$ ions per cm and having an energy of about 200 KeV were then implanted through the passivating layer into the n-type (Hg,Cd)Te body. The body was then heat treated at a temperature of about 200° C for a time of about 5 minutes.

In conclusion, the method of the present invention makes possible the fabrication of relatively sophisticated, high performance (Hg,Cd)Te photodiodes. Abrupt, well-defined junctions can be formed by ion implantation of gold followed by a very low temperature—short duration heat treatment.

Although the present invention has been described with reference to preferred embodiments, workers skilled in the art will recognize that changes may be made in form and detail without departing from the spirit and scope of the invention. For example, although the invention is often used in conjunction with an n-type (Hg,Cd)Te body, it is equally applicable to p-type (Hg,Cd)Te bodies. In fact, the fabrication of a reach-through avalanche photodiode often will entail utilizing the method of the invention to form a relatively heavily doped p-type region in a very lightly doped p-type body.

The embodiments of the invention in which an exclusive property or right is claimed are defined as follows:

1. A method of introducing acceptor impurities into a region of a mercury cadmium telluride body, the method comprising:
   implanting gold ions into the region; and
   heat treating the mercury cadmium telluride body at a temperature of between about 150° C and about 250° C for a time of between about 2 minutes and about 40 minutes.

2. The method of claim 1 wherein the heat treating is at a temperature of about 200° C for a time of about 5 minutes.

3. The method of claim 1 wherein the mercury cadmium telluride body has an n-type conductivity.

4. The method of claim 3 wherein the implanting and heat treating cause the region to have p-type conductivity.

5. The method of claim 1 wherein the gold ions have, during the implanting step, an energy of greater than about 100 KeV and a dose of between about $10^{12}$ ions per cm$^2$ and about $10^{13}$ ions per cm$^2$.

6. The method of claim 1 and further comprising, prior to the implanting step:
   forming a passivating layer on a first surface of the mercury cadmium telluride body; and
   masking the passivating layer with a gold ion impervious mask to define the region.

7. A method of forming a PN junction in an n-type body of mercury cadmium telluride, the method comprising:
   implanting gold ions into a region of the mercury cadmium telluride body; and
   heat treating the mercury cadmium telluride body at a temperature of between about 150° and about 250° C for a time of between about 2 minutes and about 40 minutes.

* * * * *